(12) United States Patent
Nishida et al.

(10) Patent No.: US 7,903,395 B2
(45) Date of Patent: Mar. 8, 2011

(54) ELECTRONIC DEVICE MOUNTING STRUCTURE

(75) Inventors: Tatsuma Nishida, Toyota (JP); Hiroshi Ueno, Toyota (JP); Atsumasa Matsui, Toyota (JP); Chihiro Tomita, Toyota (JP); Naohiro Shimajiri, Toyota (JP); Kazuo Yoshino, Toyota (JP); Kunio Kiyohara, Toyota (JP); Hiromasa Tanaka, Ashiya (JP)

(73) Assignee: Nifco Inc., Yokohama-Shi, Kanagawa-Ken (JP)

( * ) Notice: Subject to any disclaimer, the term of this patent is extended or adjusted under 35 U.S.C. 154(b) by 331 days.

(21) Appl. No.: 12/155,958

(22) Filed: Jun. 12, 2008

(65) Prior Publication Data

US 2008/0297993 A1 Dec. 4, 2008

Related U.S. Application Data

(63) Continuation of application No. PCT/JP2006/325551, filed on Dec. 21, 2006.

(30) Foreign Application Priority Data

Dec. 27, 2005 (JP) ................................. 2005-375073

(51) Int. Cl.
*H05K 5/00* (2006.01)
*H05K 7/00* (2006.01)
(52) U.S. Cl. .................................................. 361/679.01
(58) Field of Classification Search ............ 361/679.37, 361/679.38, 679.39, 679.01
See application file for complete search history.

(56) References Cited

U.S. PATENT DOCUMENTS

| 5,676,555 | A | 10/1997 | Yu et al. | |
|---|---|---|---|---|
| 6,172,299 | B1 | 1/2001 | Miyakoshi | |
| 6,839,239 | B1 | 1/2005 | Lee | |
| 6,992,886 | B2 * | 1/2006 | Salinas et al. | 361/679.38 |
| 7,724,504 | B2 * | 5/2010 | Lee | 361/679.01 |

FOREIGN PATENT DOCUMENTS

| DE | 37 24 620 | A1 | | 2/1989 |
|---|---|---|---|---|
| EP | 0 241 731 | | | 10/1987 |
| EP | 0 508 248 | A1 | | 10/1992 |
| FR | 2 714 936 | | | 7/1995 |
| JP | U-S60-34714 | | | 3/1985 |
| JP | U-H05-17211 | | | 3/1993 |
| JP | H05-17211 | Y2 | | 5/1993 |
| JP | 2982673 | | * | 9/1999 |
| JP | 2000-247188 | A | * | 9/2000 |
| JP | 2001-253302 | A | * | 9/2001 |
| JP | 2004-330846 | | | 11/2004 |
| JP | 2005-086983 | | | 3/2005 |

* cited by examiner

*Primary Examiner* — Jayprakash N Gandhi
*Assistant Examiner* — Anthony M Haughton
(74) *Attorney, Agent, or Firm* — Manabu Kanesaka

(57) ABSTRACT

An electronic device mounting structure for fitting an ECU (electronic device) in an open space formed in a device mounting housing and for holding the ECU fitted in the open space by a holding finger formed on the device mounting housing, includes a stopper formed in the device mounting housing so as to be juxtaposed with the holding finger, the stopper being configured to prevent the ECU from falling out of the device mounting housing.

8 Claims, 7 Drawing Sheets

US 7,903,395 B2

ELECTRONIC DEVICE MOUNTING STRUCTURE

TECHNICAL FIELD

The present invention relates to an electronic device mounting structure, more specifically an electronic device mounting structure suited for installing an electronic device in a vehicle.

BACKGROUND ART

For example, an electronic device for vehicle installation is configured to be installed in a vehicle by being mounted to a device mounting housing fixed to the vehicle (see, e.g. Patent Document 1). The reason is that it is possible not only to easily install an electronic device in a vehicle at the time of mounting but also to dismount the electronic device for maintenance more easily than a structure for fixing such an electronic device directly to a vehicle.

FIG. 10 shows a conventional electronic device mounting structure. This figure shows a structure for mounting ECUs (engine control units) 132 as such electronic devices for vehicle installation. The ECUs 132 are mounted to a vehicle by making use of a device mounting housing 130.

The device mounting housing 130 has a fixing portion 137 formed on a top portion 135 thereof and another fixing portion 138 formed on a bottom portion 136. The device mounting housing 130 is fixed to the vehicle by using, e.g. bolts to fix both fixing portions 137 and 138 to the vehicle.

The device mounting housing 130 has open spaces 134 formed therein to fit the ECUs 132 thereinto. The ECUs 132 are fitted into the open spaces in the direction indicated by an arrow X1 in this figure. Each of the top portion 135 and the bottom portion 136 has pressing members (retaining fingers) 139 formed therein. Each of the retaining fingers 139 is cantilevered and has a distal end projecting into each open space 134.

Each of the open spaces 134 has a stopper 140 formed on one edge thereof in the direction indicated by the arrow X1. Each of the open spaces 134 has an opening formed in the one edge in the direction indicated by the arrow X1 so as to be smaller than an end side 145 of each of the ECUs 132 by provision of the stopper 140.

On the other hand, each of the ECUs 132 has a first projection 143 and a second projection 144 formed on each of a top side 141 and a bottom side 142. The first and second projections 143 and 144 are formed on substantially central portions of the top side 141 and the bottom side 142 of each of the ECUs.

Now, how to fit the ECUs 132 into the device mounting housing 130 will be explained. In order to fit the ECUs 132 into the device mounting housing 130, the ECUs 132 are put into the open spaces 134 of the device mounting housing 130 in the direction indicated by the arrow X1. When an ECU is put into an open space of the device mounting housing, the first projection 143 formed on the ECU climbs over the retaining finger 139 projecting into the open space 134, and is set between the first projection 143 and the second projection 144 formed on the ECU. At the same time, the end side 145 of the ECU 132 is brought into contact with the stopper 140 of the open space as shown in FIG. 11.

The EUC 132 is prevented from falling out of the device mounting housing 130 in the direction indicated by the arrow X1 since the end side 145 of the ECU is brought into contact with the stopper 140 as described above. The retaining finger 139 is brought into contact with the top side 141 of the ECU 132 to be elastically deformed, generating an elastic force so as press the ECU 132 by the elastic force. In this way, the EUC 132 is held in the device mounting housing 130.

Patent Document 1: JP-A-2000-247188

DISCLOSURE OF THE INVENTION

Problems to be Solved by the Invention

However, the conventional electronic device mounting structure is configured to prevent the ECU 132 from falling out of the device mounting housing 130 by bringing the stopper 140 into contact with the end side 145 of the ECU 132. This arrangement needs to have a great length from a position with the retaining finger 139 disposed thereat to a position with the stopper 140 disposed thereat.

Accordingly, this arrangement has a problem in that the device mounting housing 130 has lateral sides having a great length in the directions indicated by the arrow X1 and an arrow X2 (a length indicated by an arrow L3 in FIG. 10), increasing the size of the device mounting housing 130. An increase in the size of the device mounting housing 130 is undesirable for vehicle installation and raises the product cost, which have been problematic.

The conventional electronic device mounting structure is configured to have the pressing members 139 formed therein so as to be spaced from the stoppers 140. If an external force is applied to an ECU 132 to shift the ECU with respect to the position with the pressing member 139 pressing the top side 141 of the ECU, the end side 145 of the ECU 132 is significantly shifted at the stopper 140, causing a problem in that the stopper 140 is likely to be disengaged from the end side 145 of the ECU.

When an ECU 132 is taken out of the device mounting housing 130, it is necessary to disengage the first and second projections 143 and 144 of the ECU from the retaining fingers 139 in engagement therewith. In the conventional electronic device mounting structure, the retaining fingers 139 are deeply set inside from the top portion 135 and the bottom portion 136 of the device mounting housing 130 when being engaged with the first and second projections of the ECU. For this reason, the device mounting housing 130 is configured to have an inner wall 146 formed in each of the open spaces so as to provide a gap between the inner wall and each of the top side 141 and the bottom side 142 of an ECU 132 so that a screwdriver 147 can be put into through the respective top and bottom gaps to cause the retaining fingers 139 to be disengaged from the first and second projections 143 and 144 of the ECU as shown in FIG. 12.

However, the conventional structure for engagement and disengagement is poor in handling. Further, the device mounting housing 130 needs to be configured to secure the gaps between the inner wall 146 and an ECU 132 for putting such a screwdriver 147 into each of the gaps. This has causes a problem in that the size of the device mounting housing 130 increases.

The present invention is proposed, taking the above-mentioned circumstances into account. It is an object of the present invention to provide an electronic device mounting structure, which is capable of not only making a housing (device mounting housing) smaller but also reliably holding an electronic device in the housing.

Means to Solve the Problem

According to a first aspect of the present invention, there is provided an electronic device mounting structure for fitting an electronic device in an open space formed in a housing and for holding the electronic device fitted in the open space by a finger formed on the housing, which includes:

a stopper formed in the housing so as to be juxtaposed with the finger, the stopper being configured to prevent the electronic device from falling out of the housing.

In accordance with the first aspect, the stopper is formed in the housing so as to be juxtaposed with the finger in order to prevent the electronic device from falling out of the housing. By this arrangement, it is possible to bring the finger closer to the stopper, with the result that it is possible to reduce the length of the housing in the direction to fit the electronic device therein and to reduce the size and the cost of the housing.

In the first aspect, it is preferred that the electronic device have a projection formed on a side thereof facing the finger, and wherein the stopper be configured to be engageable with the projection.

In this preferred mode, it is possible to more reliably prevent the electronic device from falling out of the housing since the stopper is engaged with the projection to prevent the electronic device from falling out of the housing.

According to a second aspect of the present invention, there is provided an electronic device mounting structure for fitting and holding an electronic device in an open space formed in a housing, which includes:

plural holding members formed in the housing so as to be juxtaposed each other, each of the holding members having a finger formed on an arm thereof so as to be engageable with the electronic device; and the arm of at least one of the holding members having both ends supported, and the arm of the other holding member or the arms of the other holding members being cantilevered.

In accordance with the second aspect, a holding member with an arm that has both ends supported can prevent the arm from being plastically deformed and can more reliably hold the electronic device because of being a higher rigidity than the holding member(s) with the cantilevered arm. It is possible to maintain the ease of fitting the electronic device in the open space since at least one of the holding members is configured so that the arm has both ends supported with the other holding member(s) having the cantilevered arm.

In the second aspect, it is preferred that the electronic device have respective projections formed on respective sides thereof facing the respective fingers, and that the respective holding members be configured to be engageable with the respective projection.

In this preferred mode, it is possible to more reliably prevent the electronic device from the housing since the holding members are engaged with the projections to prevent the electronic device from falling out of the housing.

According to a third aspect of the present invention, there is provided an electronic device mounting structure for holding an electronic device in a housing by engaging the electronic device with a holding member formed in the housing when the electronic device is fitted in an open space formed in the housing, which includes:

the holding member being formed of a finger engageable with the electronic device, a cantilevered arm for elastically urging the finger toward the electronic device, and a release-manipulative portion configured to disengage the finger from the electronic device by manipulating the release-manipulative portion from outside the housing.

In accordance with the third aspect, it is possible to disengage the electronic device from the finger formed on the holding member without using a tool, since the release-manipulative portion is formed on the holding member so as to be capable of disengaging the electronic device from the finger by manipulating the holding member outside the housing. Thus, it is possible to improve the manipulability of the operation for dismounting the electronic device from the housing. It is also possible to make the housing smaller since it is not necessary to form the housing so as to secure an area for accepting a tool.

In the third aspect, it is preferred that the release-manipulative portion be formed on a portion of the arm closer to a distal end of the arm than the finger, and that the release-manipulative portion be configured to be flush with or project from an outer side of the housing with the finger being engaged with the electronic device.

By this arrangement, it is easy to pick up the release-manipulative portion, with the result that it is possible to make it more manipulative to take out the electronic device.

Effects of the Invention

In accordance with the first aspect, it is possible to reduce the length of the housing in the direction to fit the electronic device therein and to reduce the size and the cost of the housing.

In accordance with the second aspect, at least one of the holding members has a high rigidity in its arm since the arm of said holding member has both ends supported. Thus, it is possible to prevent the arm from being plastically deformed and to more reliably hold the electronic device in the housing.

In accordance with the third aspect, it is possible to disengage the electronic device from the finger formed on the holding member without using a tool. Thus, it is possible to improve the manipulability of the operation for dismounting the electronic device from the housing. It is also possible to make the housing smaller since it is not necessary to form the housing so as to secure an area for accepting a tool.

BEST MODE FOR CARRYING OUT THE INVENTION

Now, the best modes for carrying out the present invention will be described in reference to the accompanying drawings.

Figure 1:
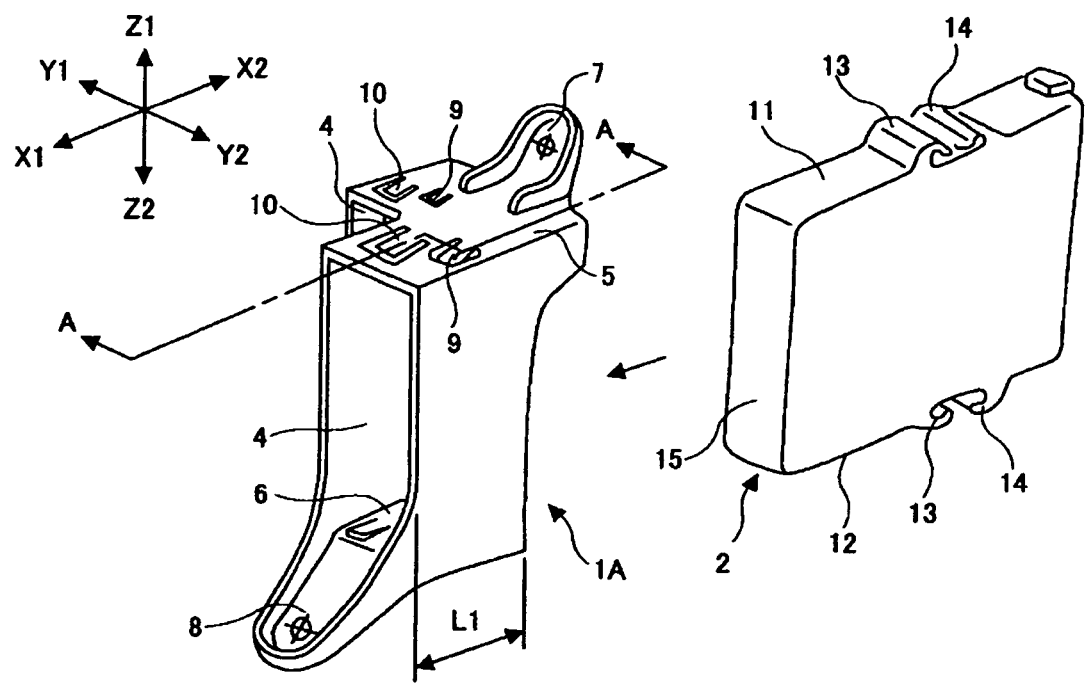
FIG. 1 is a perspective view showing the electronic device mounting structure according to a first embodiment of the present invention.

FIG. 1 shows the electronic device mounting structure according to a first embodiment of the present invention. This embodiment and the subsequent embodiments described later will be explained about a case where an ECU (engine control unit) 2 is installed as an electronic device in a vehicle.

The ECU 2 is mounted to a vehicle by making use of a device mounting housing 1A. The ECU 2 has a first projection 13 and a second projection 14 formed on each of a top side 11 and a bottom side 12 thereof. The first and second projections 13 and 14 are formed on a substantially central portion of each of the top side 11 and the bottom side 12 of the ECU in directions indicated by arrows X1 and X2.

The device mounting housing 1A is formed of a resin. The device mounting housing has a fixing portion 7 formed on a top portion 5 and a fixing portion 8 formed on a bottom portion 6. The device mounting housing 1A is fixed to the vehicle (not shown) by using, e.g. bolts to fixing the fixing portions 7 and 8 to the vehicle.

The device mounting housing 1A has an open space 4 formed therein so as to fit an ECU 2 therein. The ECU 2 is fitted in the open space 4 in the direction indicated by the arrow X1. The device mounting housing 1A has pressing members 9 and stoppers 10 formed as holding members on the top portion 5 and the bottom portion 6 thereof.

A pressing member 9 is formed of a pressing arm 15 and a pressing finger 21. The pressing arm 15 is cantilevered, and the pressing finger 21 is formed on a distal end of the pressing arm so as to project into the open space 4. The pressing member 9 is elastically deformable in the directions indicated by arrows Z1 and Z2 since not only the device mounting housing 1A is formed of a resin but also the pressing arm 15 is cantilevered as described above.

When the ECU 2 is fitted into the open space of the device mounting housing 1A, the pressing member 9 for that open space causes its pressing finger 21 to elastically deform and generate an elastic force, with the result that the pressing finger 21 presses the top side 11 of the ECU 2 by the elastic force. In this way, the ECU 2 is held in the device mounting housing 1A.

On the other hand, the stopper 10 for that open space has the function of preventing the ECU 2 from falling out of the device mounting housing 1A. The stopper 10 is formed of a stopper arm 16 and a stopper finger 22. In this embodiment, the stopper arm 16 is cantilevered, and the stopper finger 22 is formed on a distal end of the stopper arm so as to project into the open space 4.

Figure 2:
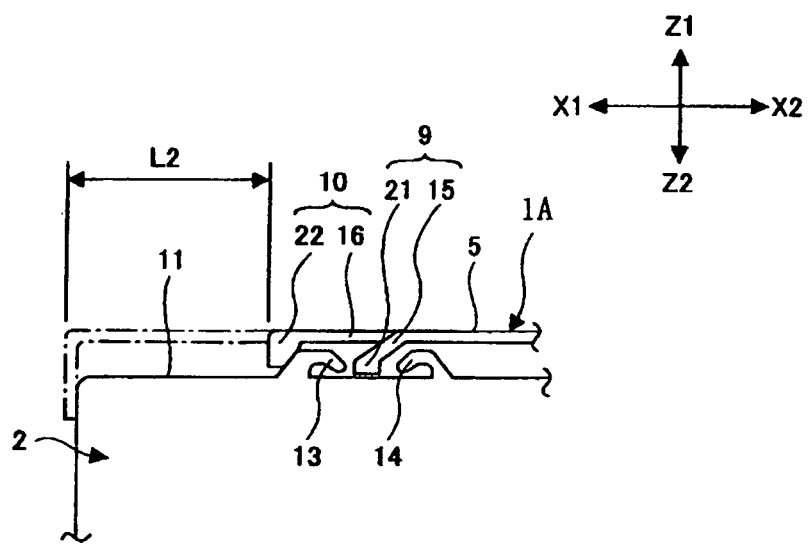
FIG. 2 is a cross-sectional view taking along line A-A of FIG. 1.

The stopper 10 is formed in each of the top portion 5 and the bottom portion 6 of the housing so as to be juxtaposed with the pressing member 9 (so as to be juxtaposed with the pressing member in the directions indicated by arrows Y1 and Y2). The stopper finger 22 of the stopper 10 is formed so as to be offset toward the direction indicated by the arrow X1 with respect to the pressing finger 21 of the pressing member 9. Specifically, as shown in FIG. 2, the stopper 10 (the stopper finger 22) is configured to be engaged with a side of the first projection 13 facing the direction indicated by the arrow X1 in this figure when the pressing member 9 (the pressing finger 21) is set between the first projection 13 and the second projection 14 by fitting the ECU 2 in the device mounting housing 1A.

Now, how to fit the ECU 2 in the device mounting housing 1A will be described.

In order to fit the ECU 2 in the device mounting housing 1A, the ECU 2 is put into the open space 4 of the device mounting housing 1A in the direction indicated by the arrow X1. As the ECU 2 is put into the device mounting housing 1A, the first projection 13 formed on the ECU 2 is first brought into contact with the pressing finger 21 of the pressing member 9, the pressing finger being located toward the direction indicated by the arrow X2 with respect to the stopper 10.

When the ECU 2 is further inserted in the direction indicated by the arrow X1, the pressing member 9 is elastically deformed, allowing the first projection 13 to pass under the pressing finger 21, since the pressing member 9 is elastically deformable as described above. When the ECU 2 is furthermore inserted in the direction indicated by the arrow X1, the first projection 13 is subsequently brought into contact with the stopper finger 22 of the stopper 10. The first projection 13 is clamped between the pressing finger 21 and the stopper finger 22 in this situation.

Thus, the ECU 2 stops its progression in the direction of the arrow X1 since the first projection 13 is brought into contact with the stopper 10 (the stopper finger 22). The ECU 2 is also prevented from falling out of the device mounting housing 1A since the first projection 13 is brought into contact with the stopper 10.

In a situation where the first projection 13 is brought into contact with the stopper 10, the pressing member 9 is located between the first projection 13 and the second projection 14 and applies its elastic force to the top side 11 in the direction indicated by the arrow Z2. In this way, the ECU 2 is held in that open space 4 of the device mounting housing 1A.

As described above, the mounting structure according to this embodiment is configured so that not only the pressing member 9 presses the top side 11 of the ECU 2 to hold the ECU 2 in the device mounting housing 1A, but also the first projection 13 is brought into contact with the stopper 10 so as to prevent the ECU 2 from falling out of the device mounting housing 1A. Further, as described above, the pressing member 9 is juxtaposed with the stopper 10.

Figure 10:
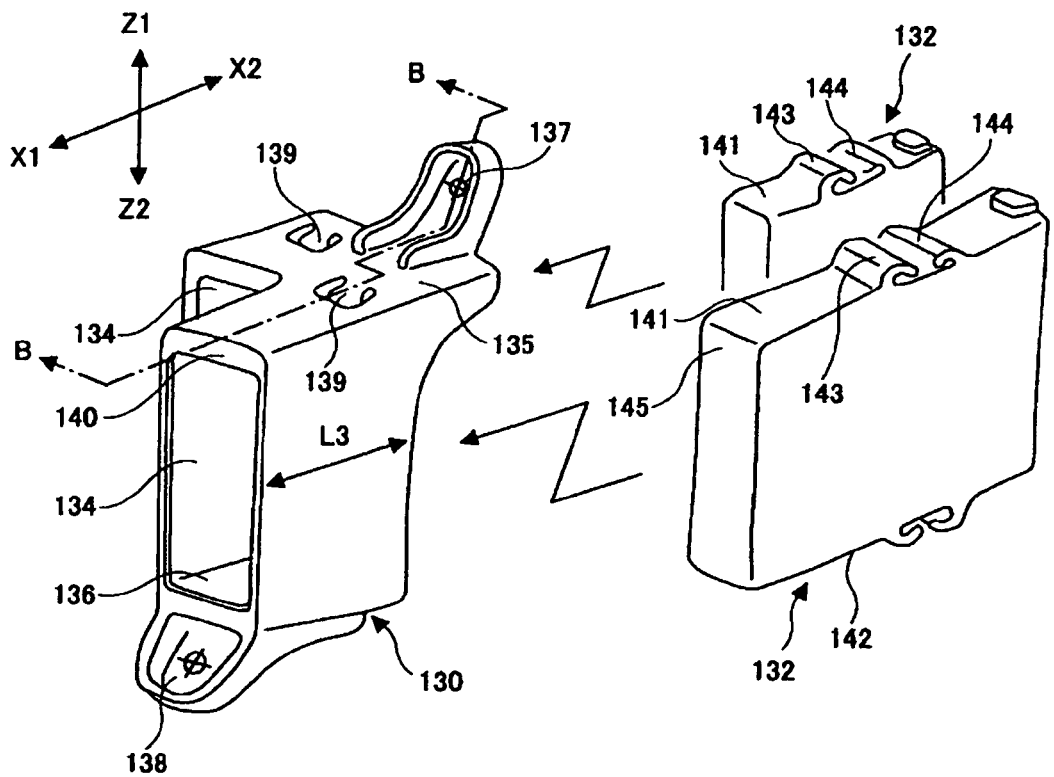
FIG. 10 is a perspective view showing a conventional electronic device mounting structure.
Figure 11:
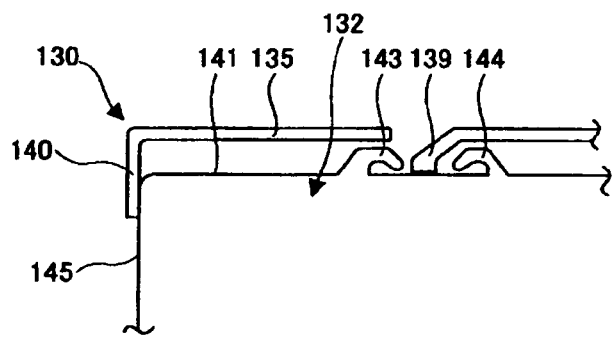
FIG. 11 is a cross-sectional view taking along line B-B of FIG. 10.

By the latter arrangement, it is possible to reduce the length of the device mounting housing 1A in the directions indicated by the arrows X1 and X2 (indicated by arrows L1 in FIG. 1) in comparison with conventional arrangements (see FIG. 10) since it is possible to bring the pressing member 9 closer to the stopper 10.

In other words, although the device mounting housing according to the conventional arrangements needs to have a top portion 5 having a great length in the direction indicated by the arrow X1 (extending by a length indicated by arrows L2 in FIG. 2) because of being configured to bring the stopper 140 into contact with an end side 15 of the ECU 2, it is possible to reduce the device mounting housing 1A by the length L2 according to this embodiment. Thus, according to the mounting structure according to this embodiment, it is possible to reduce the size and the cost of the device mounting housing 1A.

This embodiment allows the ECU to be reliably held in and prevented from falling out of the device mounting housing 1A since the first projection 13 preformed on the ECU 2 is utilized to hold the ECU 2 in the device mounting housing 1A and to prevent the ECU from falling out of the device mounting housing 1A.

The stopper 10 is engaged with the first projection 13, performing the function of pressing the ECU 2 in the direction indicated by the arrow Z2. In this way, the stopper 10 performs not only the function of preventing the ECU 2 from falling out of the device mounting housing 1A but also the function of holding the ECU2 in the device mounting housing. Accordingly, it is possible to hold the ECU 2 in the device mounting housing 1A more reliably than the conventional mounting structures.

Figure 3:
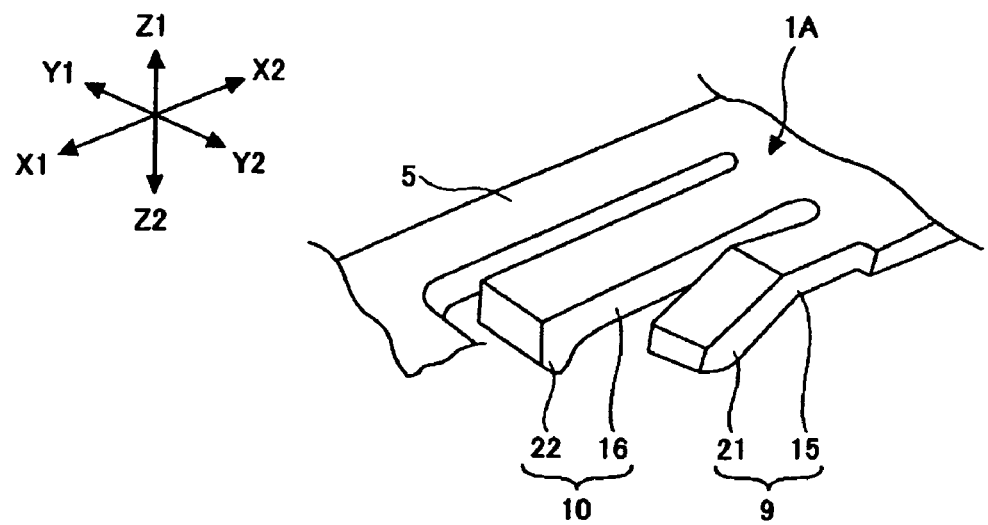
FIG. 3 is an enlarged view showing a portion of the structure close to a pressing member and a stopper according the first embodiment.

In the above-mentioned embodiment, the paired pressing member 9 and stopper 10 are disposed so as to be spaced from each other by a slight distance in the directions indicated by arrows Y1 and Y2. However, the paired pressing member 9 and stopper 10 may be disposed so as to be close to each other as shown in FIG. 3.

Now, a second embodiment of the present invention will be described.

In the above-mentioned first embodiment, the pressing arm 15 forming the pressing member 9, and the stopper arm 16 forming the stopper 10 are cantilevered. When attention is drawn to the stopper 10 performing the function of preventing the ECU 2 from falling out, the ECU 2 tends to falls out of the device mounting housing 1A in the direction indicated by the arrow X1 in the figures. When the ECU 2 is urged to fall out of the device mounting housing 1A, a force is generated so as to lift the stopper 10. This phenomenon will be explained, referring to FIG. 4.

Figure 4:
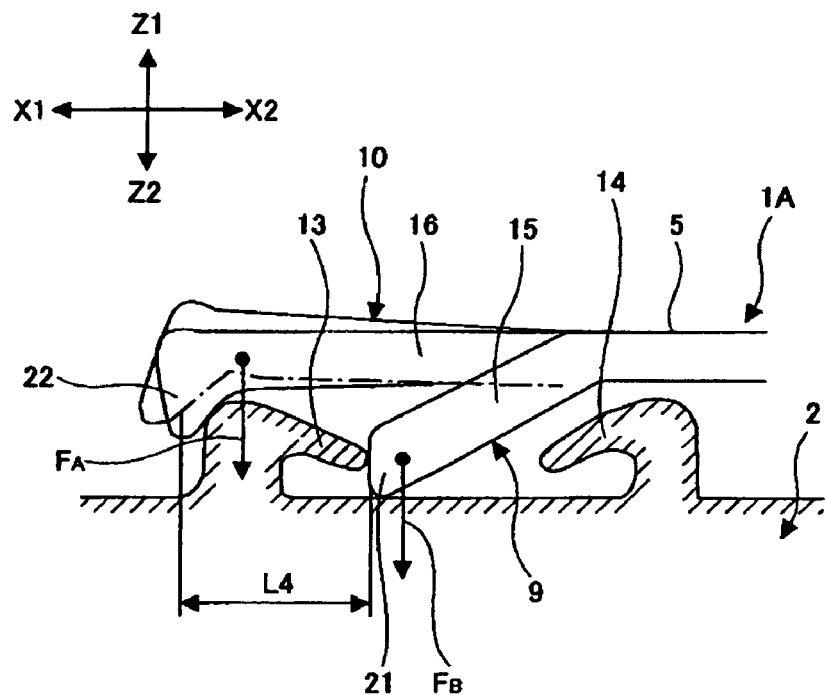
FIG. 4 is a schematic view explaining how the pressing member and the stopper according the first embodiment act.

FIG. 4 shows how forces are applied to the pressing member 9 and the stopper 10 when the ECU 2 is fitted in the device mounting housing 1A. The pressing member 9 presses the ECU 2 by a force $F_B$ in the direction indicated by the arrow Z2 as described above. In this way, the ECU 2 is restricted to move mainly in the directions indicated by the arrows Z1 and Z2 in this figure with the result that the ECU 2 is held in the device mounting housing 1A.

On the other hand, the stopper 10 causes its stopper finger 22 to be engaged with the first projection 13 and press this first projection 13 by a force $F_A$ in the directions indicated by the arrows Z1 and Z2 in this figure. The first projection 13 is clamped between the pressing finger 21 and the stopper finger 22. In this way, the movement of the first projection 13 (the ECU 2) in the direction indicated by the arrow X1 is restricted by the stopper finger 22 so as to prevent the ECU 22 from falling out of the device mounting housing 1A even if an external force is applied to the ECU 2 in a direction to cause the ECU to fall out of the device mounting housing 1A (in the direction indicated by the arrow X1 in this figure).

However, ECUs 2 have recently tended to be heavier as the ECUs for vehicle installation increase in size. Vehicles frequently change their running positions according to the steering operations during running, which means that an ECU 2 installed in a vehicle is frequently subjected to external forces. When the stopper arm 16 of the stopper 10 is cantilevered as in the first embodiment, the stopper finger is more likely to be kept open than a stopper arm having both ends supported because of having a lower rigidity than the latter stopper arm.

The phrase "kept open" means that the stopper arm 16 (and the stopper finger 22) is plastically deformed by frequent application of external forces to the stopper finger 22 in the direction indicated by the arrow X1. If the stopper 10 has been kept open, the stopper takes a position indicated by a two-dot chain line in FIG. 4.

If the stopper finger 22 has kept open as described above, the stopper finger fails to sufficiently bring the first projection 13 into engagement, and the distance between the stopper finger 22 and the pressing finger 21 (the length indicated by arrows L4 in FIG. 4) increases, with the result that the clamping force applied to the first projection 13 by the stopper finger 22 and the pressing finger 21 decreases. When the pressing arms 15 of the pressing members 9, and the stopper arms 16 of the stoppers 10 are cantilevered, it may be likely that an ECU 2 cannot be reliably held.

Figure 5:
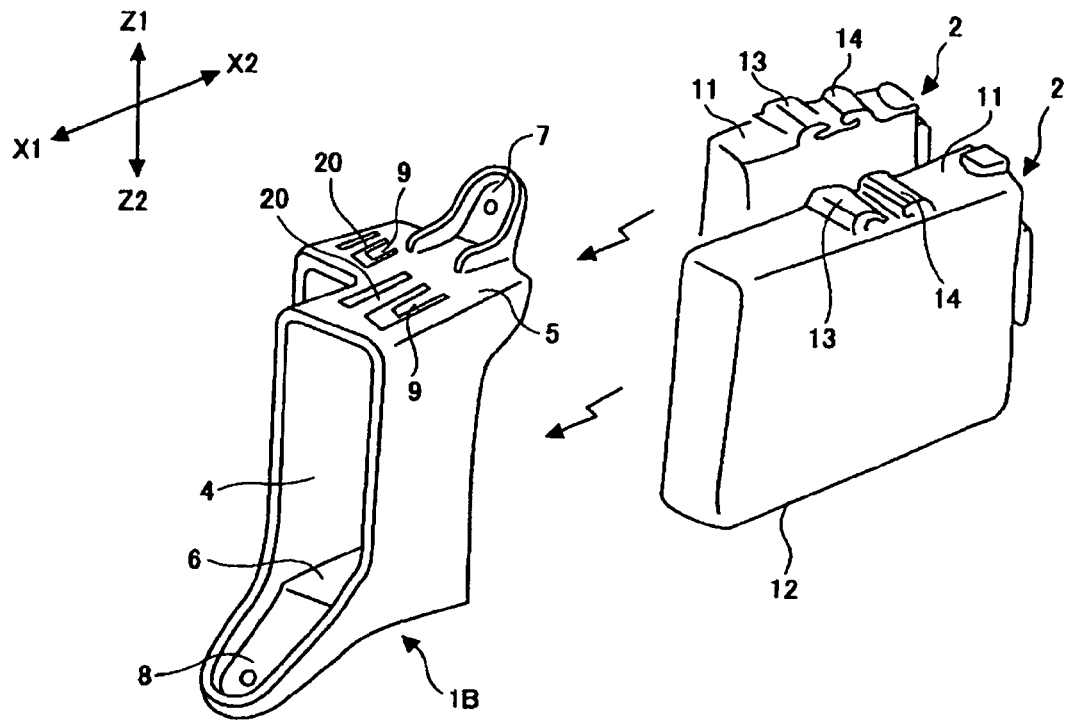
FIG. 5 is a perspective view showing the electronic device mounting structure according to a second embodiment of the present invention.
Figure 6:
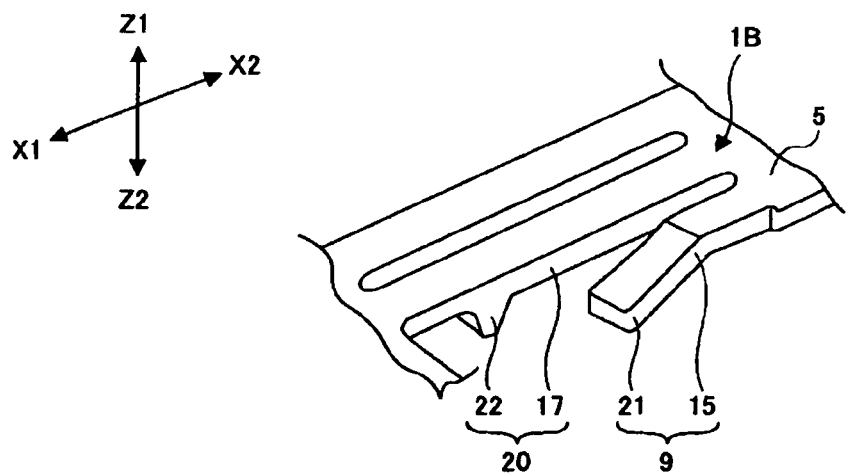
FIG. 6 is an enlarged view showing a portion of the structure close to a pressing member and a stopper according the second embodiment.

In consideration of the above-mentioned problem, the second embodiment proposes an electronic device mounting structure, which is capable of reliably holding an ECU 2 by being configured to prevent a stopper from being kept open. Now, the electronic device mounting structure according to the second embodiment will be described in reference to FIG. 5 to FIG. 7. Structure elements of the second embodiment shown in FIG. 5 to FIG. 7, which are similar to those of the first embodiment shown in FIG. 1 to FIG. 4, are indicated by similar symbols, and the explanation of these structure elements will be omitted.

The device mounting housing 1B used in the mounting structure according to the second embodiment is basically configured in a similar way to the device mounting housing 1A of the above-mentioned first embodiment. Specifically, the device mounting housing 1B has an open space 4 formed therein so as to fit the ECU 2 therein. The ECU 2 is fitted in the open space 4 in the direction indicated by the arrow X1. The device mounting housing 1B has a pressing member 9 and a stopper 20 integrally formed as the holding member on the top portion 5 thereof. (As in the first embodiment, the device mounting housing may also have a pressing member 9 and a stopper 10 formed on a bottom portion 5 thereof.)

The pressing member 9 has the same structure as that of the first embodiment, and the pressing member has a pressing arm 15 formed to be cantilevered. On the other hand, the stopper 20 is configured so that its stopper arm 17 has both ends supported as shown in enlargement in FIG. 6. The stopper has a stopper finger 22 formed on a side facing the open space 4. The stopper 20 performs the function of preventing the ECU 2 in the open space from falling out of the device mounting housing 1B. The stopper 20 is formed in the top portion 5 of the housing so as to be juxtaposed with its paired pressing member 9.

Figure 7:
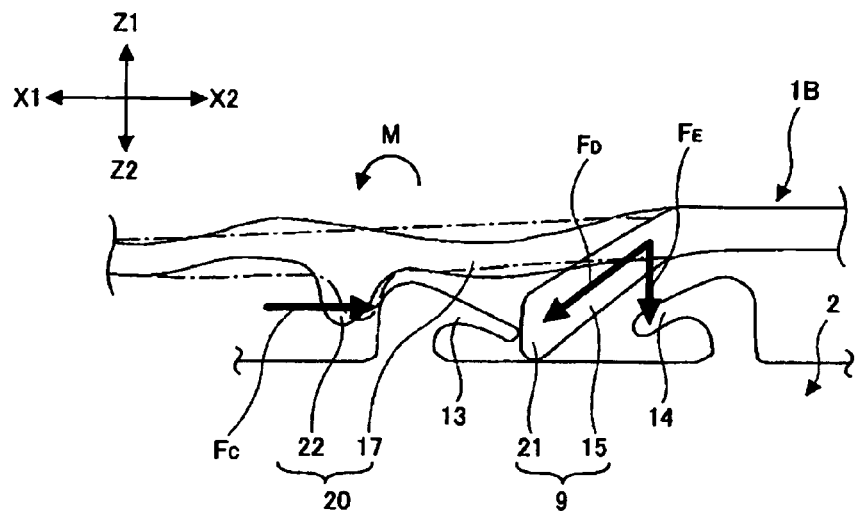
FIG. 7 is a schematic view explaining how the pressing member and the stopper according the second embodiment act.

The stopper finger 22 of the stopper 20 is configured to be offset toward the direction of the arrow X1 in this figure with respect to the pressing finger 21 of its paired pressing member 9. Specifically, as shown in FIG. 7, the stopper 20 (the stopper finger 22) is configured to be engaged with a side of the first projection 13 facing the direction of the arrow X1 in this figure when the pressing member 9 (the pressing finger 21) is located between the first projection 13 and the second projection 14 of an ECU 2 by fitting the ECU 2 into the device mounting housing 1B.

The stopper arm 17 forming the stopper has a higher rigidity than the pressing member 9 with the pressing arm 15 cantilevered because of having both ends supported by the top portion 5 of the housing as described above. In other words, the stopper finger 22 formed on the stopper 20 is more difficult to be deformed than the pressing finger 21 formed on the pressing members 9 in vertical directions (in the directions indicated by arrows Z1 and Z2 in this figure).

Now, how to fit the ECU 2 in the device mounting housing 1B will be described.

In order to fit the ECU 2 in the device mounting housing 1B, the ECU 2 is put into the open space 4 of the device mounting housing 1B in the direction indicated by the arrow X1. As the ECU 2 is put into the device mounting housing 1B, the first projection 13 formed on the ECU 2 is first brought into contact with the pressing finger 21 of the pressing member 9, the pressing finger being located toward the direction indicated by the arrow X2 with respect to the its paired stopper 20.

When the ECU 2 is further inserted in the direction indicated by the arrow X1, the pressing member 9 is elastically deformed, allowing the first projection 13 to pass under the pressing finger 21, since the pressing member 9 is elastically deformable as described above. The pressing arm 15 is susceptible to be so plastically deformable as to be capable of holding the ECU 2 in the open space 4 with good fit because of being cantilevered.

When the ECU 2 is furthermore inserted in the direction indicated by the arrow X1, the first projection 13 is subsequently brought into contact with the stopper finger 22 of the stopper 20. The first projection 13 is clamped between the pressing finger 21 and the stopper finger 22 in this situation. Thus, the ECU 2 stops its progression in the direction of the arrow X1 since the first projection 13 is brought into contact with the stopper 20 (the stopper finger 22). The ECU 2 is also prevented from falling out of the device mounting housing 1B since the first projection 13 is brought into contact with the stoppers 20.

In a situation where the first projection 13 is brought into contact with the stopper 20, the pressing member 9 is located between the first projection 13 and the second projection 14, and presses a top side 11 of the ECU in the direction indicated by the arrow Z2. In this way, the ECU 2 is held in the open space 4 of the device mounting housing 1B. The second embodiment allows the ECU to be reliably held in and prevented from falling out of the device mounting housing 1 since the first projection 13 preformed on the ECU 2 is utilized to hold the ECU 2 in the device mounting housing and to prevent the ECU from falling out of the device mounting housing.

The stopper 20 is engaged with the first projection 13, performing the function of pressing the ECU 2 in the direction indicated by the arrow Z2. In this way, the stopper 20 performs not only the function of preventing the ECU 2 from falling out of the device mounting housing 1B but also the function of holding the ECU2 in the device mounting housing. Accordingly, it is possible to hold the ECU 2 in the device mounting housing 1B more reliably.

Now, how the stopper 20 acts if an external force is applied to the ECU 2 in a direction to fall the ECU out of the device mounting housing 1B (in the direction indicated by the arrow X1) will be explained.

If the ECU 2 is urged to shift in the direction indicated by the arrow X1, the first projection 13 presses the stopper finger 22 of the stopper 20 in the direction indicated by the arrow X1, generating a bending moment in the stopper 20 in a direction indicated by an arrow M as shown in FIG. 7. By the generation of the bending moment M, a force $F_C$ is generated in the stopper finger 22 in the direction indicated by the arrow X2, while a force $F_D$ is generated in the pressing finger 21 along the pressing arm 15.

The force $F_D$ that is generated along the pressing arm 15 generates a vertical component force $F_E$ directed to the direction indicated by the arrow Z2. The vertical component force $F_E$ is a force that is newly generated in the pressing member 9 by the generation of the bending moment M and that serves as a force for holding the ECU 2 in the device mounting housing 1B. In this way, even if the ECU 2 is heavy, the structure wherein the stopper arm 17 has both ends supported allows the ECU to be reliably held since the vertical component force $F_E$ generated by the bending moment M is applied in addition to the holding force $F_B$ that is normally applied to the pressing member 9 (see FIG. 4).

In the first and second embodiments, explanation has been made about a case where each of the pressing member 9 and the stopper 10 or 20 as the holding member is disposed at a single location. However, each of the pressing member 9 and the stopper 10 or 20 as the holding member may be disposed at plural locations. In the latter case, when the arm of at least one pair of holding members among the plural holding members has both ends supported while the arms of the other holding members are cantilevered, it is possible to realize the above-identified advantages of the present invention.

Now, a third embodiment of the present invention will be described.

This embodiment is characterized in that the device mounting housing includes improved manipulative members 50. Each of the manipulative members 50 according to this embodiment is applicable to both of the pressing member 9 and the stopper 10 or 20 in the above-mentioned embodiments. The manipulative members 50 will be explained without specifying whether each of the manipulative members 50 is applied to the pressing member 9 or the stopper 10 or 20

Figure 8:
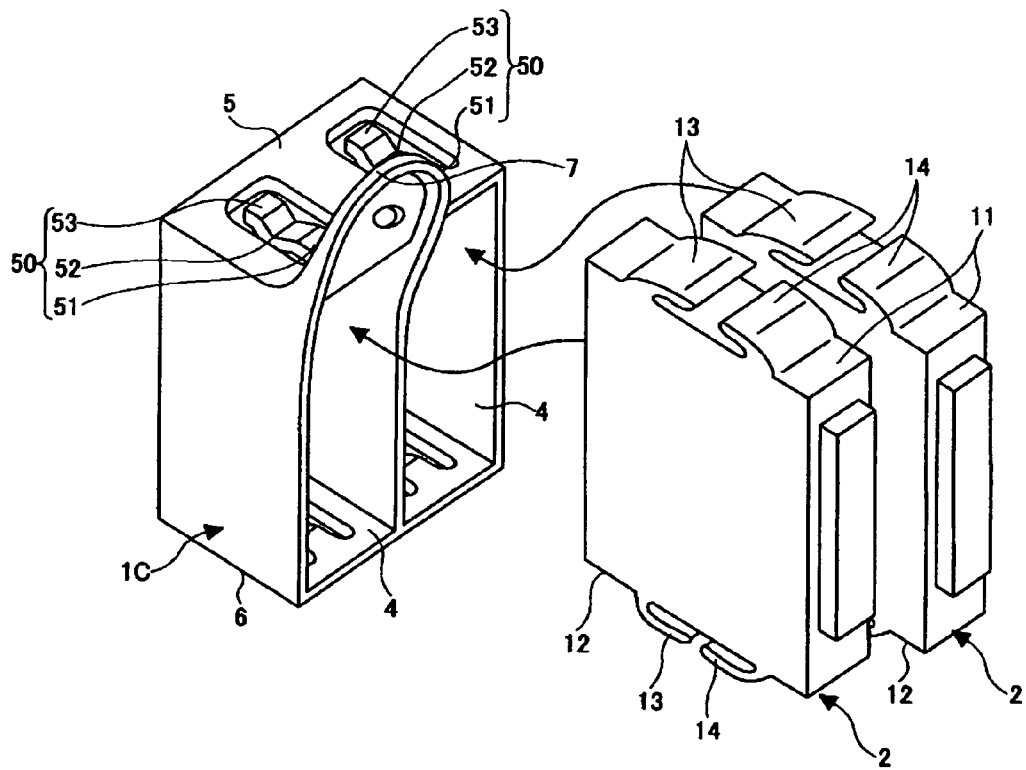
FIG. 8 is a perspective view showing the electronic device mounting structure according to a third embodiment of the present invention.

The electronic device mounting structure according to the third embodiment of the present invention will be described in reference to FIG. 8 and FIG. 9. Structure elements of the third embodiment shown in FIG. 8 and FIG. 9, which are similar to those of the first and second embodiments shown in FIG. 1 to FIG. 7, are indicated by similar symbols, and the explanation of these structure elements will be omitted.

This embodiment is characterized in that the manipulative members 50 are formed in a device mounting housing 1C to hold an ECU 2 in an open space 4, and that each of the manipulative members is formed of not only an arm 51 and a finger 52 but also a release-manipulative portion 53.

The arm 51 is cantilevered and is configured to extend obliquely downward to a lower position than the top portion 5 of the device mounting housing 1C. The arm 51 has the finger 52 formed on a distal end thereof to be engageable with the ECU 2. When attention is drawn only to the arm 51 and the finger 52 of the manipulative members, each of the manipulative members has substantially the same structure as the pressing member 9 according to the second and third embodiments.

Each of the manipulative members according to the third embodiment is characterized to have the release-manipulative portion 53 formed on a further distal end of the cantilevered arm 51, i.e. on a position ahead of the finger 52. The release-manipulative portion 53 is formed in a flange shape, which extends in the direction indicated by the arrow X1 in this figure by a slight amount (a length for ease in picking up).

Figure 9:
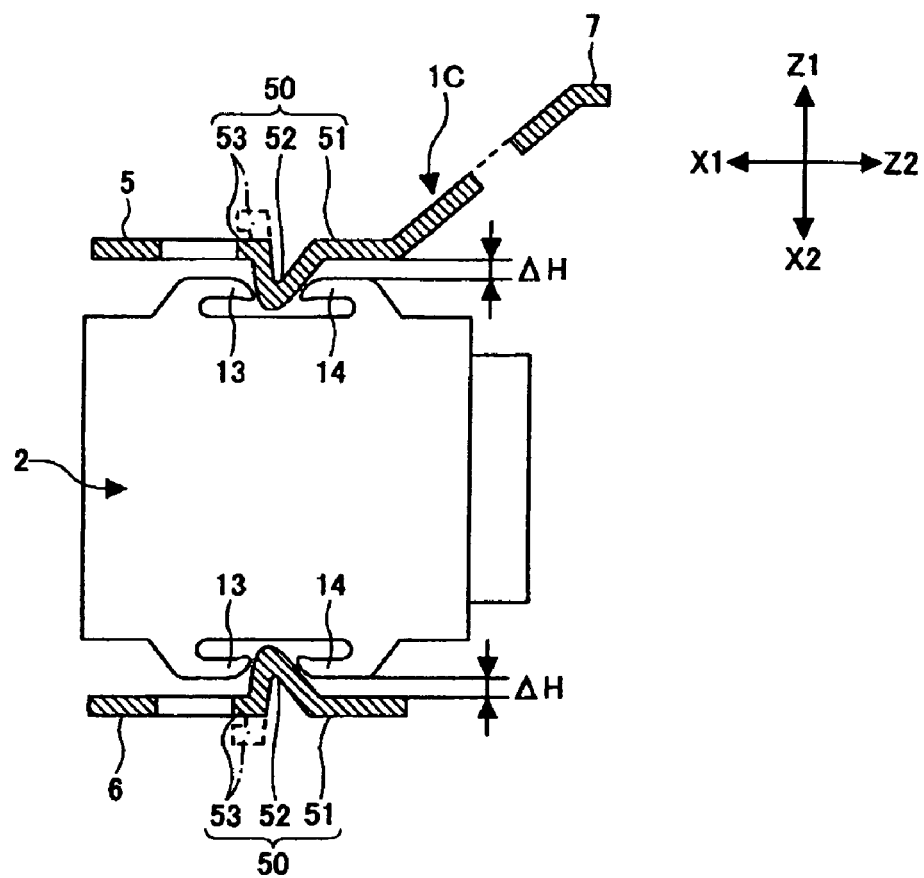
FIG. 9 is a schematic view explaining how a pressing member and a stopper according the third embodiment act.

Although the respective release-manipulative portions 53 are configured to be substantially flush with the top portion 5 and a bottom portion 6 of the housing in this embodiment, the respective release-manipulative portion 53 may be configured to project outside from the top portion 5 and the bottom portion 6 as shown in dashed dotted lines in FIG. 9.

Now, how to dismount the ECU 2 from the device mounting housing 1C of the electronic device mounting structure configured as described above will be explained. FIG. 9 shows a situation where the ECU 2 is engaged with the operating portions 50, being held in the device mounting housing 1C. The ECU 2 needs to be taken out of a vehicle for the purpose of maintenance or another reason in some cases. In these cases, the ECU 2 is dismounted from the device mounting housing 1C.

Figure 12:
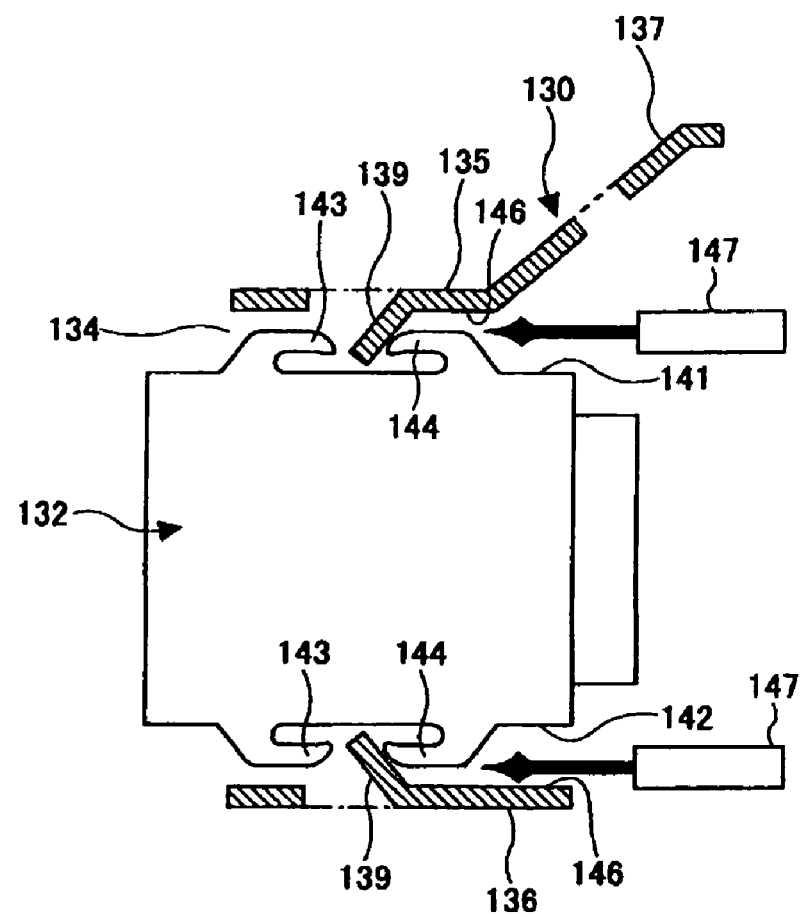
FIG. 12 is a schematic view showing how to dismount an ECU from the conventional electronic device mounting structure.

The pressing member 9 that includes only the arm 15 and the finger 21 as in the first and second embodiments needs to be disengaged from the ECU 2 by using a screwdriver as explained in reference to FIG. 12.

On the other hand, in accordance with this embodiment, it is possible to disengage the first and second projections 13 and 14 from the fingers 52 formed on the manipulative members 50 without using a tool (screwdriver), since the release-manipulative portion 53 is formed on each of the manipulative members 50. Thus, it is possible to improve the manipulability of the operation for dismounting the ECU 2 from the device mounting housing 1C. It is also possible to make the device mounting housing 1C smaller since it is not necessary to form the device mounting housing 1C so as to secure areas for accepting a tool (screwdriver).

In this embodiment, each of the release-manipulative portions 53 is configured to be flush with or project from the outer side of the top portion 5 or the bottom portion 6 of the housing with the fingers 52 being engaged with the ECU 2. By this arrangement, it is easy to pick up each of the release-manipulative portions, and it is possible to improve the manipulability of the housing when dismounting the ECU 2 from the housing.

The entire disclosure of Japanese Patent Application No. 2005-375073 filed on Dec. 27, 2005 including specification, claims, drawings and summary is incorporated herein by reference in its entirety.

The invention claimed is:

1. An electronic device mounting structure, comprising:
   a housing including an open space formed at one lateral side thereof, a pressing member, and a stopper, the pressing member and the stopper being arranged side by side and located at least on an upper side of the housing, and
   a unit to be installed inside the housing through the open space, said unit having first and second projections disposed at a side facing the pressing member and the stopper to project outwardly from the unit and spaced in a direction such that the unit is inserted in the housing through the open space,
   wherein when the unit is held in the housing, the pressing member is located between the first and second projections and the stopper engages one side of the first projection located close to the open space to prevent the unit from falling out of the housing.

2. The electronic device mounting structure according to claim 1, wherein the pressing member comprises a pressing arm supported at one side by the housing and a pressing finger formed at a free end of the pressing arm to project inside the housing, the pressing finger being located between the first and second projections when the unit is held in the housing.

3. The electronic device mounting structure according to claim 2, wherein the stopper comprises a stopper arm attached to the housing, and a stopper finger attached to the stopper arm, the stopper finger engaging the one side of the first projection when the unit is held in the housing.

4. The electronic device mounting structure according to claim 3, wherein the stopper arm has a free end to which the stopper finger is attached.

5. The electronic device mounting structure according to claim 4, wherein the stopper arm is a cantilevered arm for elastically urging the stopper finger toward the unit, and has a release-manipulative portion configured to disengage the stopper finger from the unit by manipulating the release-manipulative portion from outside the housing.

6. The electronic device mounting structure according to claim 5, wherein the release-manipulative portion is formed on a portion of the stopper arm closer to a distal end of the stopper arm than the stopper finger, and the release-manipulative portion is configured to be flush with or project from an outer side of the housing with the stopper finger being engaged with the unit.

7. The electronic device mounting structure according to claim 3, wherein the stopper arm has two ends attached to the housing, and the stopper finger is located between the two ends.

8. The electronic device mounting structure according to claim 1, wherein each of the first and second projections includes an upwardly projecting portion and a laterally projecting portion extending from the upwardly projecting portion, the laterally projecting portions of the first and second projections facing each other with a space therebetween.

\* \* \* \* \*